(12) United States Patent
Hori et al.

(10) Patent No.: US 6,677,708 B2
(45) Date of Patent: Jan. 13, 2004

(54) SEMICONDUCTOR LIGHT-EMITTING ELEMENT

(75) Inventors: Yuji Hori, Nagoya (JP); Tomohiko Shibata, Kasugai (JP); Osamu Oda, Aichi Pref. (JP); Mitsuhiro Tanaka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 190 days.

(21) Appl. No.: 10/024,664

(22) Filed: Dec. 17, 2001

(65) Prior Publication Data

US 2002/0117961 A1 Aug. 29, 2002

(30) Foreign Application Priority Data

Dec. 28, 2000 (JP) .......................................... 2000-401418
Nov. 8, 2001 (JP) .......................................... 2001-343055

(51) Int. Cl.$^7$ ................................................. H01J 1/62
(52) U.S. Cl. ........................................ 313/498; 313/506
(58) Field of Search ................................. 313/498, 499, 313/506, 509, 512

(56) References Cited

PUBLICATIONS

Takahiro Maruyama et al., "Red Emission from Eu–Doped GaN Studied by Photoluminescence and Photo–Calorimetric Spectroscopy," Japan Journal of Applied Physics, vol. 38 (1999) pp. L1306–L1308, Part 2, No. 11B, Nov. 15, 1999.

Primary Examiner—Vip Patel
(74) Attorney, Agent, or Firm—Burr & Brown

(57) ABSTRACT

In a semi-conductor light-emitting element, an underlayer is made of a high crystallinity Al-including semi-conducting nitride material of which the FWHM is 90 second or below in X-ray rocking curve. Then, a light-emitting layer is made of a semi-conducting nitride material including at least one element selected from the group consisting of Al, Ga and In and containing at least one element selected from rare earth metal elements and transition metal elements.

9 Claims, 1 Drawing Sheet

SEMICONDUCTOR LIGHT-EMITTING ELEMENT

BACKGROUND OF THE INVENTION (1) Field of the Invention

This invention relates to a semi-conductor light-emitting element, particularly usable for a white color light-emitting diode.

(2) Related Art Statement

Recently, various light-emitting diodes (LEDs) are widely available. LEDs are expected for illuminating use as well as displaying use because of their low electric power consumption, long life time, $CO_2$ gas reduction originated from the reduction of the high energy consumption such as the low electric power consumption, and thus, much demand for the LEDs are expected.

As of now, the LEDs are made of various semi-conducting material such as GaAs-based semi-conducting material, AlGaAs-based semi-conducting material, GaP-based semi-conducting material, GaAsP-based semi-conducting material and InGaAlP-based semi-conducting material, and thus, can emit various color lights from red to yellow-green. Therefore, the LEDs are employed particularly for various displaying use. Recently, blue and green LEDs have been realized by using GaN-based semi-conducting material. As a result, selecting a given LED, a given color light from red to blue, that is, within visible light range, can be obtained from the LED, and full-color displaying is also realized.

Moreover, white color light-emitting diodes (white color LEDs) are being realized by using RGB LED chips or using two color lights-emitting diodes composed of blue LEDs with yellow fluorescent substance thereon. As a result, LED illumination is being realized at present.

However, the white color LED using the RGB LED chips requires higher cost because the plural LED chips are employed, so that in view of the cost, it is difficult to employ the white color LED for illumination use. On the other hand, full color can not be recognized by the white color LED using the only color lights-emitting diode such as a combination of a blue LED and a yellow-fluorescent material because it employs only two primary colors, not three primary colors. Moreover, in the white color LED, the brightness of only about 25 lm/w can be realized, which is very small as compared with the brightness of 90 lm/W of a fluorescent tube.

Therefore, a white color LED employing three primary colors is strongly desired all over the world because of the low energy consumption taking environmental problem into consideration. In reality, such a white color LED is intensely developed by Japanese national projects and foreign major electric-manufacturing enterprises.

Such an attempt is made as to fabricate a white color LED using three or over primary colors as illuminating a three primary colors-fluorescent substance by an ultraviolet LED. This attempt is fundamentally based on the same principle as a fluorescent tube, and employs the ultraviolet LED as the ultraviolet beam from the mercury discharge in the fluorescent tube. In this case, the cost of the white color LED is increased because the three primary colors-fluorescent substance is additionally employed for the ultraviolet LED.

Using a GaN-based semi-conducting material, a blue LED can be realized, and then, using the GaN-based semi-conducting material, the ultraviolet LED can be realized. However, the luminous efficiency of the resulting ultraviolet LED is largely reduced, as compared with the blue LED.

As a result, the high luminous efficiency in such a white color LED as employing three or over primary colors through the illumination of a fluorescent substance by an ultraviolet LED is not technically prospected.

SUMMARY OF THE INVENTION

It is an object of the present invention to provide a new semi-conductor light-emitting element preferably usable for a LED to emit an any color light regardless of the dislocation density, particularly a white color LED.

For achieving the above object, this invention relates to a semi-conductor light-emitting element including a substrate, an underlayer, formed on the substrate, made of a first semi-conducting nitride material including at least Al element, a first conductive layer, formed on the underlayer, made of a second semi-conducting nitride material including at least one element selected from the group consisting of Al, Ga and In, a first cladding layer, formed on the first conductive layer, made of a third semi-conducting nitride material including at least one element selected from the group consisting of Al, Ga and In, a light-emitting layer, formed on the first cladding layer, made of a fourth semi-conducting nitride material including at least one element selected from the group consisting of Al, Ga and In and at least one element selected from rare earth metal elements and transition metal elements as an additive element, a second cladding layer, formed on the light-emitting layer, made of a fifth semi-conducting nitride material including at least one element selected from the group consisting of Al, Ga and In, and a second conductive layer, formed on the second cladding layer, made of a sixth semi-conducting nitride material including at least one element selected from the group consisting of Al, Ga and In.

In this case, if the function of a conductive layer is applied to the first cladding layer, the first conductive layer may be omitted. Similarly, if the function of a conductive layer is applied to the second cladding layer, the second conductive layer may be omitted.

Conventionally, an underlayer of a semi-conductor light-emitting element is mainly used as a buffer layer, so the crystallinity of the underlayer is not important. Moreover, in the light of the buffer layer, it is desired that the crystallinity of the underlayer is degraded to some degree.

On the other hand, in a semi-conductor light-emitting element, the conductive layers, the cladding layers and a light-emitting layer are epitaxially grown on the underlayer by an MOCVD method. Therefore, the crystallinities of the layers are reflected and affected by the crystallinity of the underlayer, and if the crystallinity of the underlayer is low, the crystallinities of the layers are also lowered. As a result, the luminous efficiency of the semi-conductor light-emitting element can not be developed sufficiently.

On the contrary, the inventors found out that, in a semi-conductor light-emitting element made of Al-including semi-conducting nitride materials, even if the crystallinity of the underlayer, which is made of an Al-including semi-conducting nitride material, is increased to some degree, the underlayer can function as a buffer layer sufficiently.

Accordingly, as mentioned above, by enhancing the crystallinity of the underlayer up to 90 seconds or below in full width at half maximum (FWHM) of X-ray rocking curve, according to the present invention, the crystallinities of the light-emitting layer or the like of the semi-conductor light-emitting element, which are formed on the underlayer, can be also developed. In addition, the high crystallinity underlayer can function as a buffer layer. As a result, the luminous efficiency of the semi-conductor light-emitting element can be developed sufficiently. Herein, the FWHM is measured at (002) reflection.

In this case, however, it is difficult to obtain an any color light, particularly a white color light from the resulting semi-conductor light-emitting element. Therefore, the inventors conceived that at least one element selected from rare earth metal elements and transition metal elements is incorporated as an additive element into the light-emitting layer.

When a rare earth metal element or a transition metal element is excited by a given external energy, it would emit a light having its inherent wavelength. Therefore, if such a rare earth metal element and/or a transition metal element is incorporated in the light-emitting layer as an additive element, it may be excited by the luminescence of the light-emitting layer, and thus, generate and emit a given light with its inherent wavelength, that is, a given color light.

Accordingly, if an additive element is appropriately selected from rare earth metal elements and transition metal elements, and then, incorporated, the light-emitting layer can be emit a given color light originated from the excited inherent color light of the additive element.

Moreover, if plural elements, for example, Tm element to generate a blue color light wavelength-region light, Er element to generate a green color wavelength-region light, Cr, Eu or Pr element to generate a red color wavelength-region light are incorporated into the light-emitting layer, these inherent color lights are superimposed, to generate and emit a white color light from the light-emitting layer.

In such a semi-conductor light-emitting element as made of Al-including semi-conducting nitride material according to the present invention, the bandgap of a semi-conductor layer constituting the element is increased as the Al content of the semi-conductor layer is increased. Then, the luminous efficiency of the light-emitting layer is increased as the bandgap of the semi-conducting nitride material of the light-emitting layer is increased.

BRIEF DESCRIPTION OF THE DRAWINGS

For better understanding of the present invention, reference is made to the attached drawings, wherein.

DESCRIPTION OF THE PREFERRED EMBODIMENTS

Figure 1:
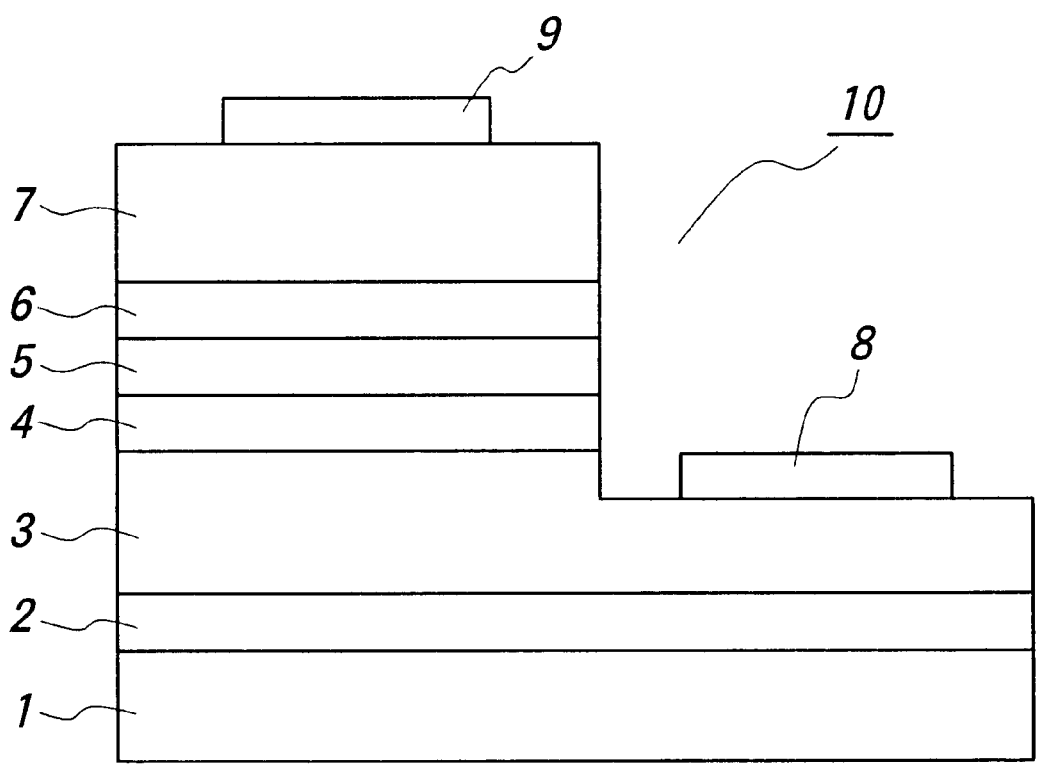
FIG. 1 is a cross sectional view showing a semi-conductor light-emitting element according to the present invention.

This invention will be described in detail with reference to the accompanying drawings.

FIG. 1 is a cross sectional view showing a semi-conductor light-emitting element according to the present invention. For clarifying the features of the present invention, some constituent elements in FIG. 1 are different from the real ones.

A semi-conductor light-emitting element 10 shown in FIG. 1 includes a substrate 1, an underlayer 2 made of AlN as a first semi-conducting nitride material which is formed on the substrate 1, a first conductive layer 3 made of n-AlGaN as a second semi-conducting nitride material which is formed on the underlayer 2.

Also, the semi-conductor light-emitting element 10 includes a first cladding layer 4 made of n-AlGaN as a third semi-conducting nitride material which is formed on the first conductive layer 3, a light-emitting layer 5 made of i-AlGaN containing an additive element selected from rare earth metal elements and transition metal element as a fourth semi-conducting nitride material which is formed on the first cladding layer 4, a second cladding layer 6 made of p-AlGaN as a fifth semi-conducting nitride material which is formed on the light-emitting layer 5, and a second conductive layer 7 made of p-AlGaN as a sixth semi-conducting nitride material which is formed on the second cladding layer 6.

The first conductive layer 3 is partially removed and exposed, and an n-type electrode 8 of Al/Pt is provided on the exposed surface of the first conductive layer 3. Then, a p-type electrode 9 of Au/Ni is provided on the second conductive layer 7.

It is required in the present invention that the FWHM of the underlayer 2 in X-ray rocking curve is set to 90 seconds or below, preferably 50 seconds or below. In this case, the crystallinity of the light-emitting layer 5 epitaxially grown above the underlayer 2 is developed, and thus, the luminous efficiency of the semi-conductor light-emitting element can be developed.

The lower limited value of the FWHM of the underlayer 2 in X-ray rocking curve is not restricted, but is preferably set to 10 seconds because the underlayer 2 is required to function as a buffer layer.

The higher crystallinity underlayer 2 can be made by heating the substrate 1 for the underlayer 2 to be formed at 1100° C. or over, preferably 1150° C. or over using raw material gases at an MOCVD method. Conventionally, an underlayer, which is almost exclusively used as a buffer layer, is made within 500–700° C. Therefore, it is turned out that the underlayer 2 is formed at much higher temperature than the conventional one. That is, the higher crystallinity underlayer 2 can be made on a quite different condition from the conventional one by an MOCVD method.

The upper limited value of the formation temperature of the underlayer 2 is not restricted, but is preferably set to 1250° C. In this case, the surface roughness due to the material composition of the first semi-conducting nitride material composing the underlayer 2 and the diffusion of the constituent elements of the underlayer 2 can be effectively inhibited. That is, regardless of the material composition of the first semi-conducting nitride material, the crystallinity of the underlayer 2 can be maintain higher, and the deterioration in crystallinity of the underlayer 2 due to the surface roughness can be inhibited. Herein, the "formation temperature" means the "temperature of the substrate 1 as the underlayer 2 is formed".

The thickness of the underlayer 2 is preferably set to 0.5 $\mu$m or over, particularly within 1–3 $\mu$m. For enhancing the crystallinities of conductive layers, cladding layers and a light-emitting layer to be formed on an underlayer, it is desired that the underlayer is formed thick. However, if the underlayer is formed too thick, some cracks are created in the underlayer and the underlayer is broken away from on the substrate. Therefore, in the case that the underlayer 2 is formed within the above temperature range according to the present invention, the thickness of the underlayer 2 is set within the above thickness range.

As mentioned above, into the i-AlGaN of the light-emitting layer 5 is incorporated the additive element selected from rare earth metal elements and transition metal elements. The content of the additive element is not restricted, and determined appropriately on the material composition of the fourth semi-conducting nitride material such as the i-AlGaN composing the light-emitting layer 5 and the desired luminescence intensity.

Practically, for high luminescence intensity, it is desired that the additive element is incorporated into the fourth semi-conducting nitride material as much as not deteriorating the crystallinity of the light-emitting layer 5. Concretely, the content of the additive element is set within 0.01–7 atomic percentages.

In this case, a light with a practically usable luminescence intensity of 80 (lm/W) can be generated and emitted from the light-emitting layer 5.

The additive element can be selected from rare earth metal elements and transition metal elements on the desired color light. As mentioned above, if Tm element is employed, a blue color wavelength-region light can be generated and emitted. If Er element is employed, a green color wavelength-region light can be generated and emitted. If Cr, Eu or Pr element is employed, a red color wavelength-region light can be generated and emitted.

Therefore, if plural additive elements are selected from the above elements and incorporated into the light-emitting layer 5, the blue color light, the green color light and the red color light are superimposed, to generate and emit a white color light from the light-emitting layer 5.

On the other hand, it is desired that the first semi-conducting nitride material composing the underlayer 2 includes Al elements of 50 atomic percentages or over for all of the III elements, particularly 100 atomic percentages, that is, made of AlN.

In a semi-conducting nitride material containing Al element, Ga element and In element, the lattice constant becomes larger as the Al content is increased. Therefore, if the underlayer 2 including a large amount of Al element is formed too thick, some cracks may be created in the underlayer 2. In this case, it is desired that a buffer layer is provided between the substrate 1 and the underlayer 2.

It is also desired that the buffer layer is composed of an Al-including semi-conducting nitride material and the Al content is increased continuously or stepwisely from the substrate 1 toward the underlayer 2. In this case, the buffer layer can exhibit its buffer effect more effectively.

It is required that the semi-conducting nitride materials such as the first semi-conducting nitride material include at least one element selected from the group consisting of Al, Ga and In. In addition, the semi-conducting nitride materials may include an additive element such as Mg, Be, Zn, Si, P, As, O (oxygen) or B as occasion demands. Moreover, the semi-conducting nitride materials may include a minute impurity contained in the raw material gases and the reactor or contained dependent on the forming condition.

The substrate 1 may be made of oxide single crystal such as sapphire single crystal, ZnO single crystal, $LiAlO_2$ single crystal, $LiGaO_2$ single crystal, $MgAl_2O_4$ single crystal, or MgO single crystal, IV single crystal or IV-IV single crystal such as Si single crystal or SiC single crystal, III-V single crystal such as GaAs single crystal, AlN single crystal, GaN single crystal or AlGaN single crystal, and boride single crystal such as $Zr_2B_2$.

Moreover, the substrate 1 may be made of such an epitaxial substrate as composed of a single crystal as mentioned above and an epitaxial growth film, formed on the single crystal, made of oxide single crystal such as ZnO single crystal or MgO single crystal, IV single crystal or IV—IV single crystal such as Si single crystal or SiC single crystal, III-V single crystal such as GaAs single crystal or InP, or a mixed crystal of these single crystals.

The semi-conductor layers composing the semi-conductor light-emitting element 10 such as the light-emitting layer 5 may be made by a conventional MOCVD method.

EXAMPLE

A sapphire single crystal substrate having a diameter of 2 inches and a thickness of 430 $\mu$m was employed, and thus, pre-treated by $H_2SO_4+H_2O_2$, and set into an MOCVD apparatus. The substrate was heated to 1200° C. with flowing a $H_2$ carrier gas at a flow rate of 10 m/sec. Then, a trimethylaluminum (TMA) gas and an ammonia ($NH_3$) gas were introduced and supplied onto the substrate at an average flow rate of 10 m/sec, to form an AlN layer as an underlayer in a thickness of 1 $\mu$m on the substrate. The FWHM of the AlN layer was 90 seconds, and thus, the good crystallinity of the AlN layer was confirmed.

Then, for protecting the AlN layer, a trimethylgallium (TMG) gas and an $HN_3$ gas were supplied onto the AlN layer at an average rate of 100 m/sec, to form a GaN film in a thickness of 100 Å on the AlN layer. Thereafter, the substrate having the AlN layer and the GaN film was taken out of the MOCVD apparatus, and then, set into an MBE apparatus.

To the MBE apparatus were attached a solid raw material system of 7N-Ga, 7N-In, 6N-Al, 3N-Er, 3N-Tm, 3N-Pr, 3N-Eu and a nitrogen gas system of atomic nitrogen gas generated by the high frequency plasma-generating apparatus at SVTA Co. Ltd. Moreover, to the MBE apparatus were attached a Si doping system and a Mg doping system so as to dope the n-type dopant Si and the p-type dopant Mg, respectively.

First of all, the substrate was heated to 900° C., and a $H_2$ gas and an $NH_3$ gas were flown, to remove the GaN film as a protective layer. Thereafter, the substrate was heated to 1000° C. and held for 30 minutes, to flatten the surface of the AlN layer, and a Si-doped n-$A_{0.15}Ga_{0.85}N$ layer as a first conductive layer was formed in a thickness of 1 $\mu$m at 750° C.

Then, a Si-doped n-$Al_{0.2}Ga_{0.8}N$ layer was formed, as a first cladding layer, in a thickness of 1 $\mu$m on the n-$Al_{0.15}Ga_{0.85}N$ layer at 780° C. Thereafter, an i-$Al_{0.1}Ga_{0.85}In_{0.05}N$ layer was formed, as a light-emitting layer, in a thickness of 0.1 $\mu$m on the n-$Al_{0.2}Ga_{0.8}N$ layer at 780° C. During the formation of the i-$Al_{0.1}Ca_{0.85}In_{0.05}N$ layer, Er element, Tm element, Pr element and Eu element were doped at the same time.

Then, a Mg-doped p-$Al_{0.2}Ga_{0.8}N$ layer was formed, as a second cladding layer, in a thickness of 50 Å on the i-$A_{0.2}Ga_{0.8}In_{0.8}N$ layer at 780° C., and finally, a Mg-doped p-GaN layer was formed, as a second conductive layer, in a thickness of 2000 Å at 780° C.

Thereafter, the resulting multi-layered structure was partially removed, to expose partially the n-$Al_{0.15}Ga_{0.85}N$ layer as the first conductive layer. Then, an n-type electrode of Al/Ti was provided on the exposed surface of the n-$Al_{0.15}Ga_{0.85}N$ layer, and a p-type electrode of Au/Ni was provided on the p-GaN layer as the second conductive layer.

Thereafter, when a voltage of 3.5 V was applied between the p-type electrode and the n-type electrode, to flow a current of 20 mA through the thus obtained semi-conductor light-emitting element, a white color light was emitted from the element at a high luminous efficiency. Therefore, the semi-conductor light-emitting element obtained in this Example can be practically used as a white color light-emitting element.

Although the present invention was described in detail with reference to the above examples, this invention is not limited to the above disclosure and every kind of variation and modification may be made without departing from the scope of the present invention.

For example, in the semi-conductor light-emitting elements shown in FIG. 1 and Example, the lower side layers from the light-emitting layer are made of n-type semi-conducting nitride materials, and the upper side layers from the light-emitting layer are made of p-type semi-conducting nitride materials, but the other way around will do. Moreover, although the semi-conductor layers such as the light-emitting layer which are formed on the underlayer are formed by an MBE method, they may be made by an MOCVD method in the same manner as the underlayer.

Moreover, in the semi-conductor light-emitting elements shown in FIG. 1 and Example, although the first conductive layer is formed directly on the underlayer, it may be formed on a buffer layer as mentioned above or a multilayered structure such as a distorted superlattice structure, which is provided on the underlayer.

As mentioned above, the semi-conductor light-emitting element of the present invention includes a high crystallinity underlayer, and thus, a high crystallinity light-emitting layer. Then, an additive element selected from rare earth metal elements and transition metal elements is incorporated into the light-emitting layer. Therefore, by selecting the additive element appropriately, a given color light, particularly, a white color light can be generated and emitted from the semi-conductor light-emitting element.

What is claimed is:

1. A semi-conductor light-emitting element comprising:
    a substrate,
    an underlayer, formed on the substrate, made of a first semi-conducting nitride material including at least Al element,
    a first conductive layer, formed on the underlayer, made of a second semi-conducting nitride material including at least one element selected from the group consisting of Al, Ga and In,
    a first cladding layer, formed on the first conductive layer, made of a third semi-conducting nitride material including at least one element selected from the group consisting of Al, Ga and In,
    a light-emitting layer, formed on the first cladding layer, made of a fourth semi-conducting nitride material including at least one element selected from the group consisting of Al, Ga and In and at least one element selected from rare earth metal elements and transition metal elements as an additive element, a second cladding layer, formed on the light-emitting layer, made of a fifth semi-conducting nitride material including at least one element selected from the group consisting of Al, Ga and In, and a second conductive layer, formed on the second cladding layer, made of a sixth semi-conducting nitride material including at least one element selected from the group consisting of Al, Ga and In.

2. A semi-conductor light-emitting element as defined in claim 1, wherein the Al content of the first semi-conducting nitride material composing the underlayer is set to 50 atomic percentages or over for all of the III elements.

3. A semi-conductor light-emitting element as defined in claim 2, wherein the first semi-conducting nitride material composing the underlayer is AlN.

4. A semi-conductor light-emitting element as defined in claim 1, wherein the underlayer is made of the first semi-conducting nitride material at 1100° C. or over by an MOCVD method.

5. A semi-conductor light-emitting element as defined in claim 4, wherein the underlayer is made of the first semi-conducting nitride material within 1100–1250° C. by the MOCVD method.

6. A semi-conductor light-emitting element as defined in claim 1, wherein the content of the additive element is set within 0.01–7 atomic percentages.

7. A semi-conductor light-emitting element as defined in claim 1, wherein the fourth semi-conducting nitride material composing the light-emitting layer includes a first additive element to generate a blue color wavelength-region light, a second additive element to generate a green color wavelength-region light and a third additive element to generate a red color wavelength-region light, the first through the third additive elements being selected from rare earth metal elements and transition metal elements, whereby a white color light is entirely generated and emitted from the light-emitting layer.

8. A semi-conductor light-emitting element as defined in claim 1, wherein a buffer layer is provided between the substrate and the underlayer.

9. A semi-conductor light-emitting element as defined in claim 8, wherein the buffer layer is made of an Al-including semi-conducting nitride material, and the Al content of the buffer layer is increased continuously or stepwisely from the substrate toward the underlayer.

* * * * *